(12) United States Patent
Winther-Jensen et al.

(10) Patent No.: US 6,628,084 B1
(45) Date of Patent: Sep. 30, 2003

(54) METHOD AND APPARATUS FOR THE EXCITATION OF A PLASMA

(75) Inventors: Bjørn Winther-Jensen, Copenhagen (DK); Kristian Glejbøl, Albertslund (DK)

(73) Assignee: NKT Research Center A/S, Brondby (DK)

( * ) Notice: Subject to any disclaimer, the term of this patent is extended or adjusted under 35 U.S.C. 154(b) by 0 days.

(21) Appl. No.: 09/889,543

(22) PCT Filed: Jan. 18, 2000

(86) PCT No.: PCT/DK00/00018

§ 371 (c)(1),
(2), (4) Date: Sep. 17, 2001

(87) PCT Pub. No.: WO00/44207

PCT Pub. Date: Jul. 27, 2000

(30) Foreign Application Priority Data

Jan. 20, 1999 (DK) .................................... 1999 00067

(51) Int. Cl.[7] .................................................. H01J 7/24
(52) U.S. Cl. ............................... 315/111.21; 118/723 R
(58) Field of Search ..................... 315/111.21; 313/581, 313/306; 118/723 R; 204/192.1, 192.32

(56) References Cited

U.S. PATENT DOCUMENTS

| | | | |
|---|---|---|---|
| 4,029,995 A | 6/1977 | Itoh | ........................... 361/226 |
| 5,013,338 A | * 5/1991 | Anand et al. | ..................... 96/4 |
| 5,332,880 A | 7/1994 | Kubota et al. | ......... 219/121.52 |
| 5,436,424 A | 7/1995 | Nakayama et al. | .... 219/121.43 |
| 5,571,366 A | * 11/1996 | Ishii et al. | ............... 118/723 L |

FOREIGN PATENT DOCUMENTS

| | | |
|---|---|---|
| EP | 0 741 404 | 11/1996 |
| EP | 0 831 679 | 3/1998 |

* cited by examiner

*Primary Examiner*—Don Wong
*Assistant Examiner*—Thuy Vinh Tran
(74) *Attorney, Agent, or Firm*—Pearne & Gordon LLP

(57) ABSTRACT

A method for the excitation of a plasma in which a gas is subjected to an electric field by a plurality of electrode systems. According to the invention at least two separate electrode systems are used which are power supplied from separate generators with the same frequency, the voltage variations of the generators being shifted in phase relative to each other such that a voltage zero never occurs at the same time in two of the electrode systems, a kind of rest period also occurring, in which there is no significant potential difference between the phases. As a result a pulsating plasma is obtained, as the plasma is generated by the potential difference between the phases. When there is no significant potential difference between the phases, an added substance may interact with its own functionality.

25 Claims, 4 Drawing Sheets

METHOD AND APPARATUS FOR THE EXCITATION OF A PLASMA

This application claims the benefit of International Application Number PCT/DK00/00018, which was published in English on Jul. 27, 2000.

TECHNICAL FIELD

The invention relates to a method for the excitation of a ply in which a gas is subjected to an electric field by means of at least two separate electrode systems, which are power supplied from separate generators of the same frequency, the voltage variations of the generators being shifted in phase relative to each other.

BACKGROUND ART

It is often advantageous to use a low-frequency alternating voltage instead of DC voltage for generating a plasma in order to prevent the formation of constant sparks between the electrodes. In this connection low-frequency signifies frequencies above 2 Hz, but below 10 Hz. One of the advantages of using low-frequency alternating voltage is that an impedance matching between the generator and the plasma is not required. Another advantage of using low-frequency alternating voltage is that reactive losses in power supply lines, feed-throughs and the like can be ignored, which simplifies the equipment design significantly.

The known systems use an electrode or an electrode system supplied by one alternating voltage. However this configuration only render few possibilities for adjusting the intensity and homogeneity of the plasma to the particular need Furthermore it is known from EP 0831679 to discharge the voltages for generating the plasma from one phase by means of a power portion, the individual portions of the power being substantially equally shifted in phase relative to each other.

BRIEF DESCRIPTION OF THE INVENTION

The object of the invention is to show how to provide AC electrode systems which are able to meet several different requirements of intensity and homogeneity in the generated plasma.

A method of the above type is according to the invention characterised by choosing the phases and/or the amplitudes in an asymmetrical way so as to obtain a kind of a periodical rest period in which there is no significant potential difference between the phases, voltage zero never occurring simultaneously in two of the electrode systems.

As a result a pulsating plasma is obtained, as the plasma is powered by the potency difference between the phases. In the part of the period in which no particular potential difference exist between the phases, an added substance may interact with its own functionality.

In this context generator signifies a voltage/power source, in which the phase of the alternating voltage on the output is substantially insensitive to the load caused by the plasma. A generator may be a transformer connected directly to one of the three phases of the mains and zero or between two of the three phases of the mains. A generator may also be formed of another voltage source rendering an oscillating signal as an output signal, the frequency of which being determined by a local control circuit.

By using two electrode systems a plasma with relatively low intensity is obtained in relation to a plasma with many electrode systems that are all supplied with the same voltage.

Moreover according to the invention the electrodes may be placed along a circle, the plasma being generated in the center of the circle. As a result the plasma is generated in an inhomogeneous zone adjacent the electrodes, while the central part of the chamber is filled with homogenous "diffusion" plasma. The conditions in the plasma in the homogenous central part are such that reactions, which normally would not be produced in conventional plasma equipment, can be obtained, as the molecules are only broken into smaller fragments in this area. The plasma is thus "gentle" towards an added substance, such as an added monomer.

In another configuration the electrodes are placed along a cylindrical body which in turn is encased in a tube, the plasma being generated between the electrodes and the interior of the tube. During the generation of the plasma the tube is thus able to rotate slowly.

In a particularly advantageous embodiment the phase shift between two phase may be Φ, where $$0.5 < \Phi + 1 \cdot \pi < 2.5$$

where 1 is a positive integer. By selecting an asymmetrical phase shift, the intensity of the plasma may be varied during the oscillation period, eg by displacing the two phases by 30° such that a pulsating plasma is generated, the plasma being generated by means of the potential difference between the phases. As a result an added monomer is able to interact with its own functionality, ie to obtain a form of equilibrium in the part of the period when there is no significant potential difference between the phases.

At higher voltage amplitudes of one of the phases it is possible to perform tasks, in which for instance a special geometry of the blank implies special requirements. As an example it is often necessary in an internal plasma processing to place an electrode inside the tube or hose and to impress a higher voltage on this electrode than on the electrodes generating the rest of the plasma.

Optionally according to the invention three or more discrete electrode systems are used, which are power supplied from separate generators, at least two of the said generators being of the same frequency and used to generate an AC plasma, the voltage variations of the generators being shifted in phase relative to each other, and at least one of the electrode systems comprising at least two electrodes. The third phase may thus for instance be used for depositing a metal coating by a cathode sputtering process. Optionally this phase can also be for cleaning the surface of a blank.

The invention further relates to a use of the method according to the invention for excitating a fluorescent material.

BRIEF DESCRIPTION OF THE DRAWINGS

The invention is explained in greater detail below with reference to the accompanying drawings, in which.

BEST MODE FOR CARRYING OUT THE INVENTION

Figure 1:
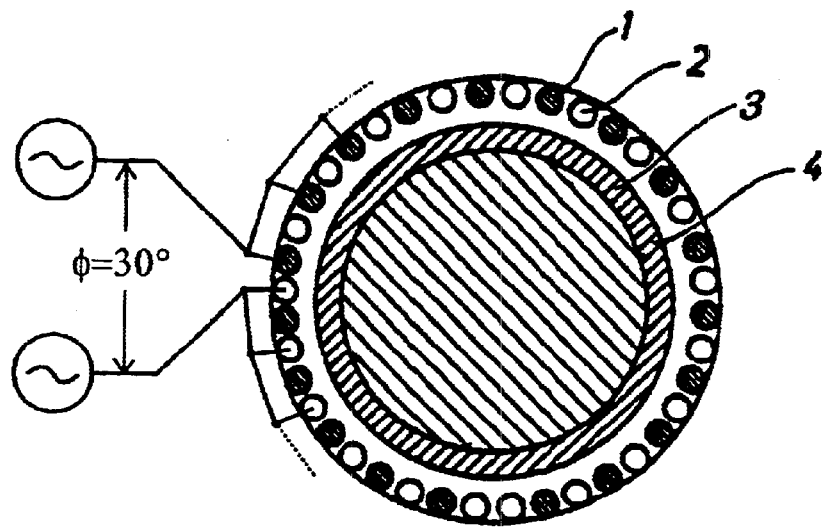
FIG. 1 shows a cylindrical reactor for the excitation of a plasma by means of a plurality of electrode systems, each electrode system comprising a number of electrodes placed along the inner surface of the cylindrical reactor.

The cylindrical reactor shown in FIG. 1 for the excitation of a plasma, wherein a gas, e.g., argon, helium, or nitrogen, is subjected to an electric field generated by a plurality of electrode systems, said reactor comprising a plurality of electrodes arranged along the inner surface of the reactor. Having many electrodes of the same phase 1 and 2, respectively, the plasma is generated in an inhomogeneous zone 3 adjacent the electrodes, while the central part of the reactor chamber is filled with a homogenous "diffusion" plasma. The conditions in the plasma in the homogenous central part 4 are such that reactions, which normally would not be produced in conventional plasma equipment, are obtained, as the molecules are only broken into smaller fragments in this area. The plasma is thus "gentle" towards an added substance, such as an added monomer.

Figure 2:
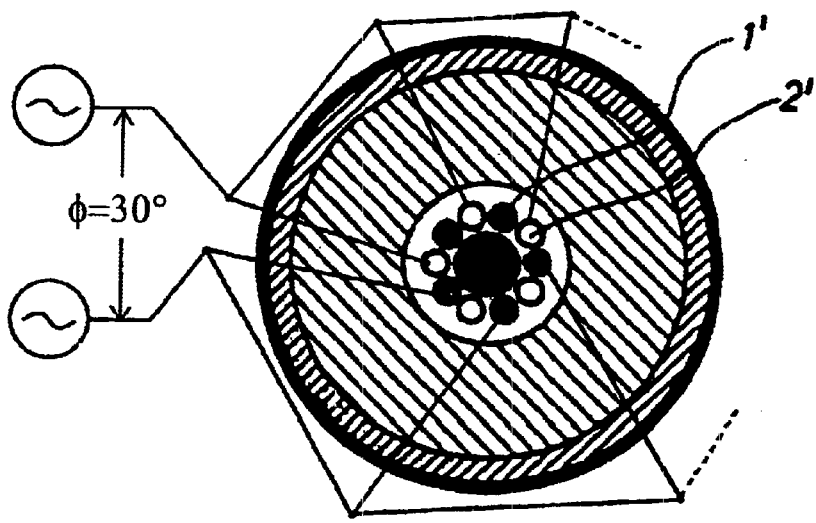
FIG. 2 shows a reactor with an electrode configuration wherein the electrodes are arranged in the centre of the cylindrical reactor, and the plasma is generated between the electrodes and the inner surface of the reactor.

In an optional embodiment shown in FIG. 2, the electrodes 1' and 2', respectively, are arranged in the centre of the cylindrical reactor and the plasma is generated substantially between the electrodes 1', 2' and the inner surface of the reactor. The shown electrode configurations are only some of the many possible symmetrical and asymmetrical applications.

The generators operating the reactors may be provided in different ways. In this context generator signifies a voltage source, in which the phase of the alternating voltage on the output is substantially insensitive to the load caused by the plasma. A generator may be a transformer connected directly to one of the three phases of the mains and zero or between two of the three phases of the mains. A generator may also be formed of another voltage source rendering an oscillating signal as an output signal, the frequency of which being determined by a local control circuit.

According to the invention two, three or more electrode systems may be used which are supplied with power from separate generators having the same frequency, but shifted in phase relative to each other. The phase shift between two phases is $\Phi$, where for instance $0.5<\Phi+1\cdot\pi<2.5$ and 1 is a positive integer. Other ratios are, however, also possible. The phase shift between the individual phases may vary. However, by choosing an asymmetrical phase shift, the intensity of the plasma may be varied during the oscillation period, eg by arranging three (out of three) phases with a phase shift of 30°, a pulsating plasma is obtained, the plasma being generated by the potential difference between the phases. A monomer (for instance acryl or vinyl added to the reactor) will then interact with its own functionality in the portion of the period in which there is no significant potential difference between the phases. This reactor is activated by the radicals formed during the plasma period in the surface of the monomer. An example thereof is plasma polymerization of vinylpyrolidol, where a constant plasma tends to destroy the ring structure in the monomer.

A higher voltage (amplitude) of one of the phases furthermore makes it possible to solve tasks in connection with blanks of a special geometry. During a plasma processing of the interior of thin flexible tubings it is often necessary to place an electrode inside the tubing and impress a higher voltage amplitude on this electrode than on the electrodes generating the other plasma.

It it often desired to combine plasma modification or plasma polymerization of a surface with other processings either before or after the plasma processing, eg cleaning (before) or metallisation (after).

Figure 3A:
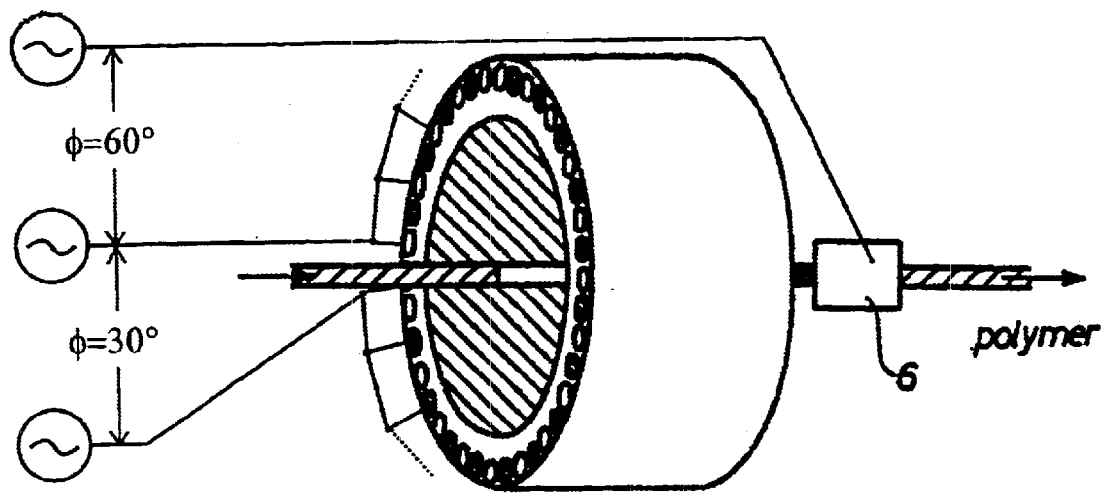
FIGS. 3 and 4 show a part of a system for generating a two-step process, in which an AC plasma is generated during a first process by means of two or more phases and the surface of a blank is cleaned during a second process.
Figure 4:
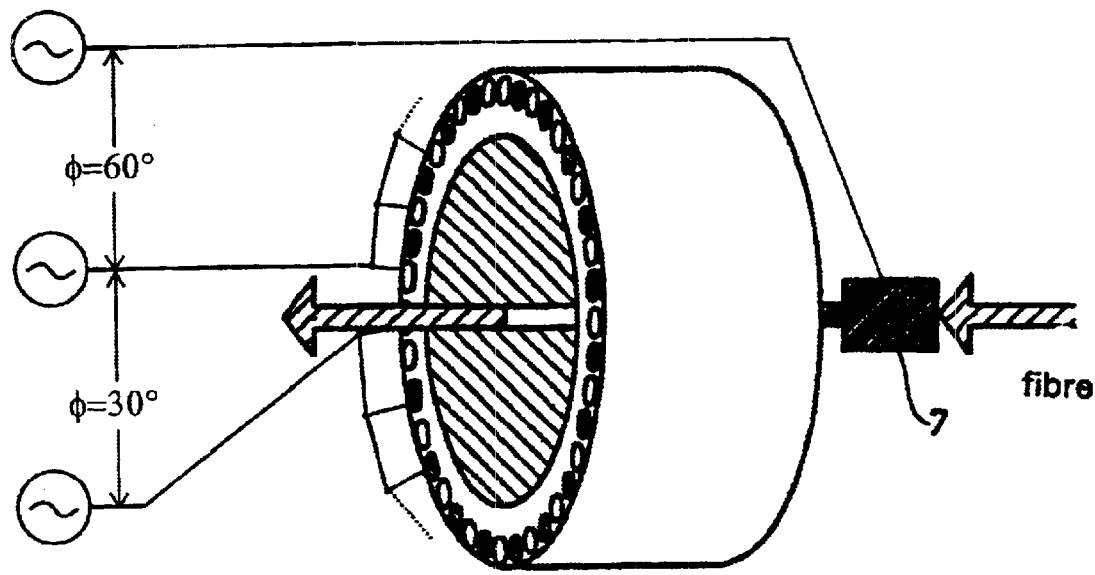
Figure 3B:
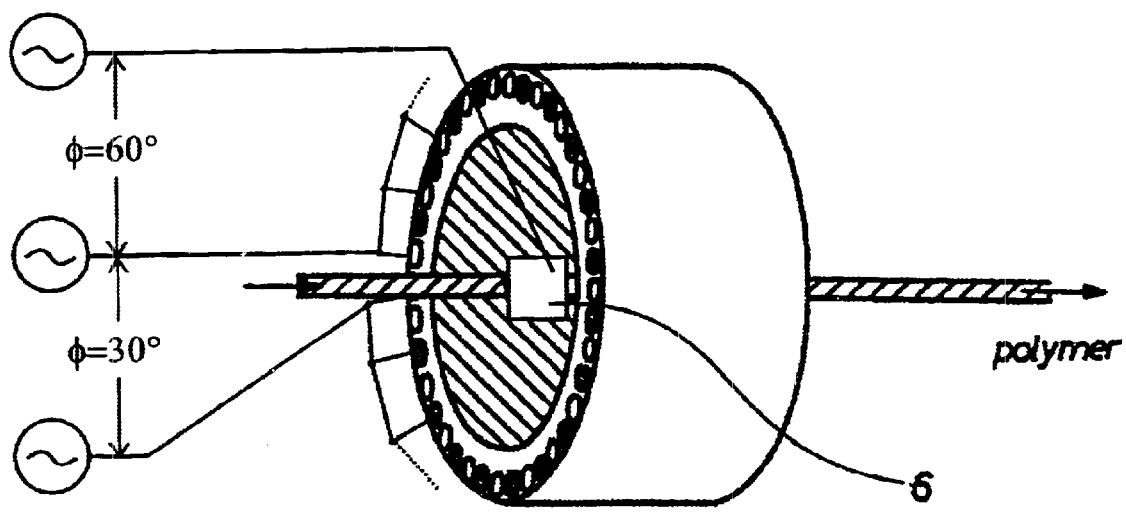

In a particularly advantageous embodiment shown in FIGS. 3 and 4 it is shown how some of these processes may be combined in one and the same vacuum chamber.

This combination of processes may be obtained by using three or more separate electrode systems power supplied from separate generators. At least two of these generators operate at the same frequency and are used to generate an AC plasma.

The voltage variations of the plasma generators are, however, shifted in phase, preferably such that a voltage zero never occurs at the same time in these two electrode systems. Each electrode system comprises n, m electrodes, where n, m is greater than or equal to 1; at least one of the electrode system must, however, comprise at least two electrodes.

By selecting few (for instance two) electrode systems a plasma with relatively low intensity is obtained in relation to a plasma with many electrode systems, when the same voltage is impressed on the electrode systems.

The combined process steps are powered by a generator which may have the same or another frequency than the plasma generators or by a DC voltage. This process step is placed in or adjacent the AC plasma such that this process step may exchange free electrons and/or ions with the AC plasma. When intensifying the combined process steps (with magnets or high voltage) a very high electron or power density may be obtained which can be used for instance for cleaning undesirable material, such as grease or oil from the surface of a blank or to power a cathode sputtering process, in which a metal or another material is to be applied to the blank from a cathode sputtering electrode. If the blank is oblong, eg in form of a cable in unrolled state, both the unwinding and the winding take place in the vacuum chamber per se. The cylindrical vacuum chamber, of which only a disc-shaped portion is shown in FIGS. 3 and 4, has typically a diameter of 55 mm and a length of 130 cm. The pressure in the chamber is preferably between 0.01 and $10^4$ Pa.

As mentioned above, the term generator signifies a voltage source, in which the phase of the alternating voltage on the output is substantially insensitive to the load caused the plasma. In this context a generator may be a transformer connected directly to one of the three phases of the mains and zero or between two of the phases. A generator may also be formed of another voltage source rendering an oscillating signal as an output signal, the frequency of which being determined by a local control circuit.

The plasma electrode systems used are supplied with power from separate generators, the output voltages thereof operating at the same frequency, but being shifted in phase relative to each other. The phase shift between two phases may be $\Phi$, where for instance $0.5<\Phi+1\cdot\pi<2.5$ and 1 is a positive integer. Other ratios are, however, also possible. In systems comprising more than two phases, the phase shift between the separate phases may differ.

As mentioned above, by choosing an asymmetrical phase shift, the intensity of the plasma may be varied during the oscillation period, eg by phase shifting three (out of three) phases with 30° a pulsating plasma is obtained, the plasma being generated by the potential difference between the phases. As a result a monomer, which has been added to the reactor chamber, is able to interact with its own functionality in the part of the period in which there is no significant potential difference between the phases.

EXAMPLE 1

By combining an area containing a "soft" plasma (many electrodes per phase) with for instance two phases including one electrode having a third phase, optionally amplified by means of magnetic fields, in an adjacent area, a situation arises, in which a polymer, such as PTFE, in the "soft" area may be modified in the surface by means of an added monomer, whereafter the polymer is brought adjacent the third phase, in which a coating of metal—confer FIG. 3—such as platinum or silver is applied by means of a cathode sputtering process (at 6), where the electrode material is the metal to be sputtered on the polymer. In this configuration it may be an advantage that the impressed voltage at the third phase (at 6) is not the same as at the other phases. It is also necessary that the electrodes are not made of the same metal, but of metals with different sputtering rates.

EXAMPLE 2

A cleaning (at 7) of for instance a continuous carbon fibres for process facilities (eg lubricants) may be combined with plasma polymerization of a coating (eg fluorine polymer for PTFE or PVDF), confer FIG. 4.

EXAMPLE 3

Polymerization of Vinylpyrolidon

Plasma polymerization of vinylpyrolidon is normally not possible without causing a ring opening of the five-member ring at the nitrogen atom, whereby the plasma-polymerised layer is provided with other properties than polyvinyl pyrolidon prepared at conventional radical polymerization. The reason why is that other (several) processes take place in the plasma than the processes necessary for a radical polymerization, and which unfortunately destroy the monomer in an undesirable manner. Polyvinyl pyrolidon is inter alia used for making surfaces more bio-compatible.

By allowing periods of time, in which a potential difference exists between the electrodes and whereby a plasma is generated—alternating with periods without potential difference, the monomer is (nearly only) able to perform a radical polymerization in the voltage-free periods based on the radicals generated in the periods with plasma.

The differences between the various plasma polymerisations appear from the FTIR spectra of NaCl crystals which are plasma-polymerised with vinyl pyrolidon on the surface.

If ring opening takes place, the carbonyl peak changes from 1706 $cm^{-1}$ to 1692 $cm^{-1}$ or lower at the same time as an amine peak occurs at about 3300 $cm^{-1}$.

The best results are obtained at a pressure of 0.15 mbar, a voltage amplitude of 160V, a phase shift of the three phases of 30°, 30° and 300° and with argon as plasma gas (in addition to vinyl pyrolidon). Optionally the best results are obtained at two phases with a shift of 120°/240°, a voltage amplitude of 240 V and/or the same conditions as with three phases. In both cases a processing time of 60 seconds renders a complete covering of the surfaces.

EXAMPLE 4

Continuous Silver Plating of Polyethylene

A (profiled) band (cable) of polyethylene (or another polymer such as PP, EVA, PVDF, PTFE, FEP . . . ) is wound through a two-step processing, in which a "binder" is initially plasma-polymerised on the polymer surface, the silver being immediately subsequent thereto cathode sputtered on said binder.

The plasma for the plasma polymerization is driven by a "two-phased" plasma. Argon and ethylcyanoacrylate are used as plasma gasses in the polymerization.

Figure 5:
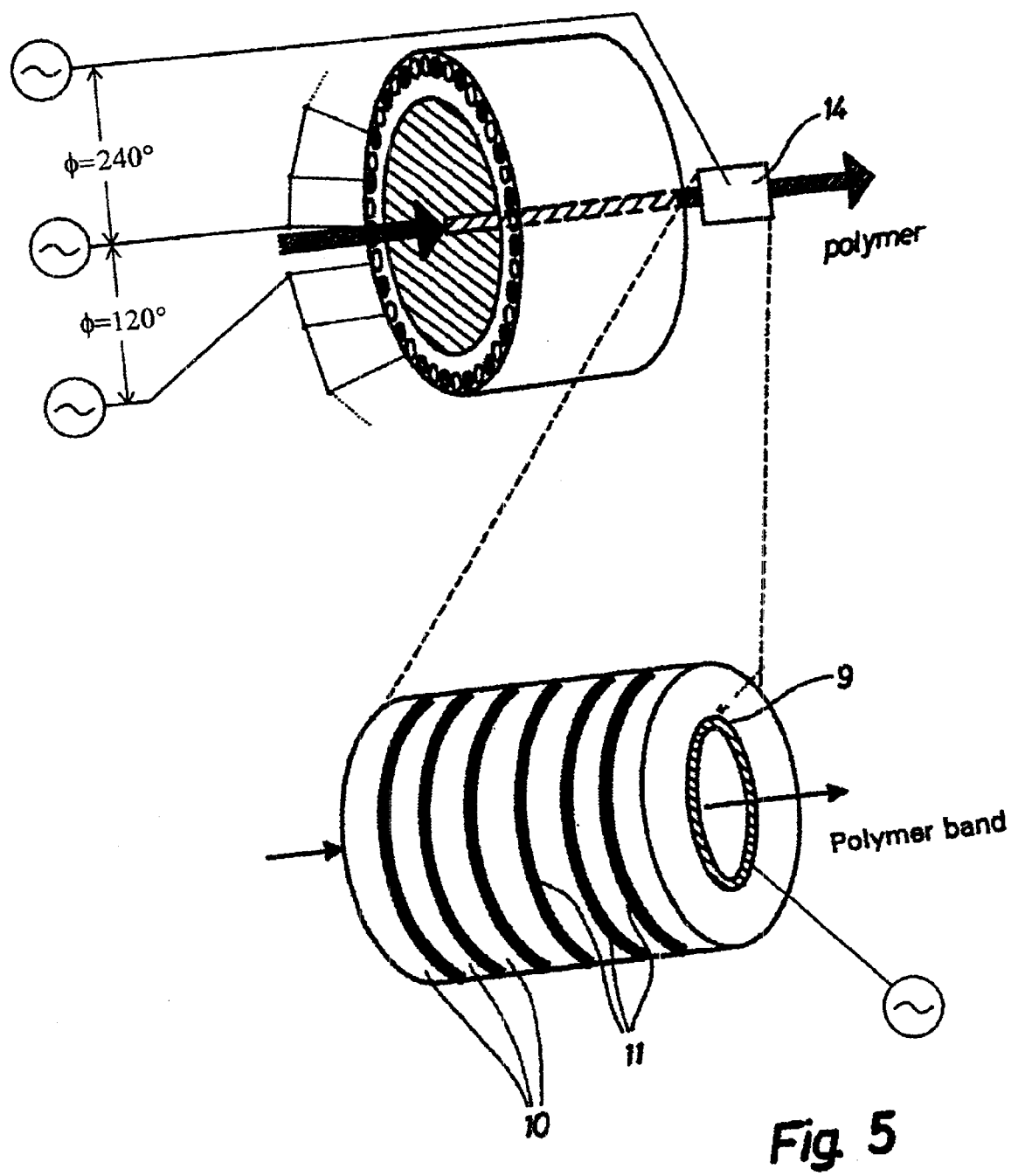
FIG. 5 shows a system for continuous coating of silver by cathode sputtering.

A third phase is connected to a tubular cathode sputter 14, through which the polymer band is inserted—confer FIG. 5. The cathode sputter 14 is formed of 30 mm long silver tubing 9 enclosed by four ring magnets 10 separated by PTFE discs 11. The cathode sputter is furthermore encased by an insulating tube and a water cooler for conducting the produced heat away from the outer surface thereof.

The phase shift between the three phases is 120°.

At a pressure of 0.2 mbar and a voltage amplitude of 400 V between the two plasma phases and 280 V on the sputtering phase, a covering silver layer was obtained having a good adherence at a band velocity of 3 m/min. It was subsequently possible to deposit copper on this silver layer by means of an electroplating process.

EXAMPLE 5

Plasma Coating of Pigments with Polyacrylic Acid

In order to adapt pigments (eg carbon black) to aqueous media such as paint and ink (eg for InkJet), it is desirable that the pigment surface is highly hydrophilic in order to obtain a good dispersion of the pigment in the aqueous medium.

This object is accomplished by placing 100 g of pigment in a rotating cylindrical drum, in which a set of electrodes are arranged about a cylindrical axis. The pigment is arranged in the space between the rotating drum and the electrodes. The diameter of the drum is 25 cm, and the distance between the drum and the electrodes is 5 cm, the length of the drum being 30 cm. The electrodes are connected to two power supplies having a phase shift of 120°. At a voltage amplitude of 320–450 V across the electrodes and a pressure of 0.2 mbar, a plasma of a suitable intensity is generated between the electrodes and the drum. Argon and acrylic vapour is fed to the drum in the ration 3:1, the drum rotating with five rpm for exposing the pigment to the plasma. A processing time of five minutes is required in order to coat the entire pigment surface with polymerised acrylic acid.

EXAMPLE 6

Polyphase AC Plasma as (Flexible) Light Source

A set of electrodes is arranged on the inner surface of a flexible, transparent tube. This can for instance be obtained by pultruding thin conductors (eg 12 aluminium conductors with a diameter of 0.5 mm) lengthwise of the inner surface of a silicone or a PU tube (with an inside bore of 30 mm) such that an angle of 140° of the stripped metal of the conductors abuts the interior of the tube. The electrodes are connected to two or three phases AC having a phase shift of 120°.

The inner surface of the tube is coated with one layer of fluorescent material (like a fluorescent tube) or the fluorescent material (powder) is mixed into the polymer prior to pultrusion.

The pressure in the tube is reduced to 1 mbar. The gas used may for instance be argon or atmospheric air.

At a voltage amplitude of from 120 to 280 V a plasma is generated in the tube. The plasma excites the fluorescent material such that light is emitted from the tube. The fluorescent material is chosen so as to provide the light from the tube with the desired colour.

What is claimed is:

1. A method of producing a pulsating plasma of low intensity, the method comprising subjecting a gas to an electric field, the, electric field being generated by means of at least two separate electrode systems, at least one of the two separate electrode systems comprising at least two electrodes, wherein said at least two electrode systems are being power supplied from separate generators of the same frequency and of voltage variations shifted in phase relative to each other so that a rest period of no significant potential difference exists between said shifted phases.

2. A method according to claim 1, wherein at least one of the separate generators is in the form of a transformer connected directly to either one of the three phases of the mains and zero, or between two of the phases.

3. A method according to claim 1, wherein the electrical field is generated by means of at least two separate electrode systems, the voltage variation of the generators being shifted in phase by about 180° relative to each other.

4. A method according to claim 1 or 2, wherein the phase shift between two phases is $\Phi$ wherein $0.5<\Phi+I\cdot\pi<2.5$ and I is a positive integer.

5. A method according to claim 1, wherein the electrodes are placed along a cylindrical body, which in turn is encased in a tube, the plasma being generated between the electrodes and the interior of the tube.

6. A method according to claim 5, wherein the electrical field is generated by means of at least three separate electrode systems.

7. A method according to claim 1, wherein the voltage variation of the generators are shifted asymmetrically relative to each other.

8. A method according to claim 1, wherein the electrical field are generated by means of two separate electrode systems, each of the systems comprises at least two electrodes.

9. A method according to claim 8, wherein said electrodes of the two separate electrode systems are being connected alternatingly to shifted phases.

10. A method according to claim 8 or 9, wherein said electrodes of the electrode systems are placed alternately to surround a space wherein the plasma is generated.

11. A method according to claim 1, wherein the voltage amplitude used at one of the phases is higher than those voltage amplitudes used at other phases.

12. A method according to claim 1, further comprising generation of an additional process selected from a group consisting of a cleaning process and a sputtering process, wherein said additional process is conducted in the plasma, and wherein a further cleaning/sputtering electrode system operated at an electron or power density used for cleaning undesirable material or for sputtering a metal to a blank is placed in the plasma.

13. A method of plasma polymerization of a monomer onto a surface, the method comprising providing a pulsating plasma of low density as defined in claim 1, adding the monomer to said pulsating plasma, and exposing the surface to said monomer containing pulsating plasma.

14. A method according to claim 13, wherein the monomer is acrylic acid vinyl pyrrolidon, or ethylcyanoacrylate.

15. An apparatus for producing a pulsating plasma of low intensity, the apparatus comprising:

(a) a reaction chamber for containing a plasma;

(b) a gas supply for supplying a gas to said reaction chamber;

(c) at least two separate electrode systems for generating an electrical field in said vacuum chamber, said at least two separate electrode systems having at least one electrode system comprising at least two electrodes; and (d) separate power supply generators for providing power supplies of same frequency, said at least two separate electrode systems being power supplied from said separate power supply generators of the same frequency and of voltage variations shifted in phase relative to each other so that a rest period of no significant potential difference exists between said shifted phases.

16. An apparatus according to claim 15, wherein said reaction chamber is a vacuum chamber, said vacuum chamber having a pressure in the range between 0.01 and $10^4$ Pa.

17. An apparatus according to claim 15 or 16 wherein said vacuum chamber is a flexible, transparent tube.

18. An apparatus according to claim 15, further comprising a rotating cylindrical drum for containing a sample.

19. An apparatus according to claim 15 wherein said supply of gas comprises an addition substance, preferably a monomer.

20. An apparatus according to claim 19, wherein said supply of gas comprises a gas selected from a group consisting of argon, helium, and nitrogen, said additional substance being acrylic acid, vinyl pyrrolidon, or ethylcyanoacrylate.

21. An apparatus according to claim 15 wherein said at least two separate electrode systems consist of three or more separate electrode systems power supplied from separate generators, at least two of said generators operating at the same frequency and used to generate an AC plasma.

22. An apparatus according to claim 21, further comprising a generator having same or different frequency as said plasma generators, or a generator generating a DC voltage.

23. An apparatus according to claim 22 further comprising density intensifiers comprising magnets or high voltage generators.

24. An apparatus according to claim 15, 21, or 22, further comprising a cleaning unit, a cathode sputtering electrode, or a combination thereof.

25. An apparatus according to claim 24, wherein said cathode sputtering electrode is a silver tubing.

* * * * *

UNITED STATES PATENT AND TRADEMARK OFFICE
CERTIFICATE OF CORRECTION

PATENT NO.      : 6,628,084 B1                                           Page 1 of 1
DATED           : September 30, 2003
INVENTOR(S)     : Bjørn Winther-Jensen et al.

It is certified that error appears in the above-identified patent and that said Letters Patent is hereby corrected as shown below:

<u>Title page,</u>
Item [57], ABSTRACT,
Line 4, after "electrode systems", please insert -- 1, 2 --.

<u>Column 1,</u>
Line 11, please delete "ply", and insert therefor -- plasma --.

<u>Column 8,</u>
Line 5, after "acid", please insert -- , -- (comma).

Signed and Sealed this

Thirtieth Day of December, 2003

JAMES E. ROGAN
*Director of the United States Patent and Trademark Office*